United States Patent
Sasaki et al.

(10) Patent No.: US 11,721,792 B2
(45) Date of Patent: Aug. 8, 2023

(54) LIGHT EMITTING DEVICE AND FLUIDIC MANUFACTURE THEREOF

(71) Applicant: eLux Inc., Vancouver, WA (US)

(72) Inventors: Kenji Alexander Sasaki, West Linn, OR (US); Paul J. Schuele, Washougal, WA (US); Mark Albert Crowder, Portland, OR (US)

(73) Assignee: eLux Inc., Vancouver, WA (US)

( * ) Notice: Subject to any disclaimer, the term of this patent is extended or adjusted under 35 U.S.C. 154(b) by 161 days.

(21) Appl. No.: 17/157,977

(22) Filed: Jan. 25, 2021

(65) Prior Publication Data
US 2021/0151633 A1    May 20, 2021

Related U.S. Application Data

(60) Continuation of application No. 16/268,416, filed on Feb. 5, 2019, now Pat. No. 10,930,819, which is a
(Continued)

(51) Int. Cl.
*H01L 33/00* (2010.01)
*H01L 33/48* (2010.01)
(Continued)

(52) U.S. Cl.
CPC ............ *H01L 33/483* (2013.01); *H01L 24/95* (2013.01); *H01L 24/97* (2013.01); *H01L 25/0753* (2013.01); *H01L 25/50* (2013.01); *H01L 33/20* (2013.01); *H01L 24/29* (2013.01); *H01L 24/32* (2013.01); *H01L 24/83* (2013.01); *H01L 33/62* (2013.01); *H01L 2224/291* (2013.01);
(Continued)

(58) Field of Classification Search
CPC .............................. H01L 33/005; H01L 33/08
See application file for complete search history.

(56) References Cited

U.S. PATENT DOCUMENTS 4,907,062 A    3/1990    Fukushima
5,355,577 A    10/1994   Cohn
(Continued)

FOREIGN PATENT DOCUMENTS

EP    2523214    11/2014

OTHER PUBLICATIONS

Jacobs, H et al "Fabrication of a cylindrical display by patterned assembly," Science, vol. 296, No. 5566 Apr. 2002, 3 pages.
(Continued)

*Primary Examiner* — Mark V Prenty
(74) *Attorney, Agent, or Firm* — HDC Intellectual Property Law, LLP

(57) ABSTRACT

Light emitting devices and methods for their manufacture are provided. According to one aspect, a light emitting device is provided that comprises a substrate having a recess, and an interlayer dielectric layer located on the substrate. The interlayer dielectric layer may have a first hole and a second hole, the first hole opening over the recess of the substrate. The light emitting device may further include first and second micro LEDs, the first micro LED having a thickness greater than the second micro LED. The first micro LED and the second micro LED may be placed in the first hole and the second hole, respectively.

22 Claims, 12 Drawing Sheets

Related U.S. Application Data continuation of application No. 15/650,192, filed on Jul. 14, 2017, now Pat. No. 10,230,020, which is a division of application No. 14/749,569, filed on Jun. 24, 2015, now Pat. No. 9,722,145.

(51) Int. Cl.
*H01L 33/20* (2010.01)
*H01L 23/00* (2006.01)
*H01L 25/075* (2006.01)
*H01L 25/00* (2006.01)
*H01L 33/62* (2010.01)

(52) U.S. Cl.
CPC ............... *H01L 2224/32225* (2013.01); *H01L 2224/83143* (2013.01); *H01L 2224/83424* (2013.01); *H01L 2224/83447* (2013.01); *H01L 2224/83488* (2013.01); *H01L 2224/83805* (2013.01); *H01L 2224/83815* (2013.01); *H01L 2224/95001* (2013.01); *H01L 2224/95085* (2013.01); *H01L 2224/95101* (2013.01); *H01L 2224/95136* (2013.01); *H01L 2224/95146* (2013.01); *H01L 2224/97* (2013.01); *H01L 2924/10155* (2013.01); *H01L 2924/12041* (2013.01); *H01L 2924/15153* (2013.01); *H01L 2924/15155* (2013.01); *H01L 2933/0033* (2013.01); *H01L 2933/0066* (2013.01)

(56) References Cited

U.S. PATENT DOCUMENTS

| | | |
|---|---|---|
| 6,417,025 B1 | 7/2002 | Gengel |
| 6,566,744 B2 | 5/2003 | Gengel |
| 6,737,801 B2 | 5/2004 | Ragle |
| 7,528,422 B2 | 5/2009 | Murphy |
| 7,727,804 B2 | 6/2010 | Smith |
| 7,874,474 B2 | 1/2011 | Kim et al. |
| 8,426,227 B1 | 4/2013 | Bil et al. |
| 8,629,465 B2 | 1/2014 | Yu et al. |
| 8,791,473 B2 | 7/2014 | Yokogawa |
| 10,930,819 B2 * | 2/2021 | Sasaki .................. H01L 33/483 |
| 2004/0068864 A1 | 4/2004 | Hadley et al. |
| 2004/0113875 A1 | 6/2004 | Miller et al. |
| 2009/0230174 A1 | 9/2009 | Kim et al. |
| 2011/0273410 A1 | 11/2011 | Park et al. |
| 2014/0008696 A1 | 1/2014 | Kim et al. |
| 2015/0155445 A1 | 6/2015 | Zhan et al. |
| 2015/0179894 A1 | 6/2015 | Herner |

OTHER PUBLICATIONS

Park, S. et al. "Printed Assemblies of inorganic light-emitting diodes for deformable and semitransparent displays," Science, vol. 235, No. 977, Aug. 2009, 6 pages.

Park, S. et al "A first implementation of a automated reel-to-teel fluidic self-assembly machine," Advanced Material, vol. 26, No. 34. Sep. 2014, Available online Jun. 2014.

* cited by examiner

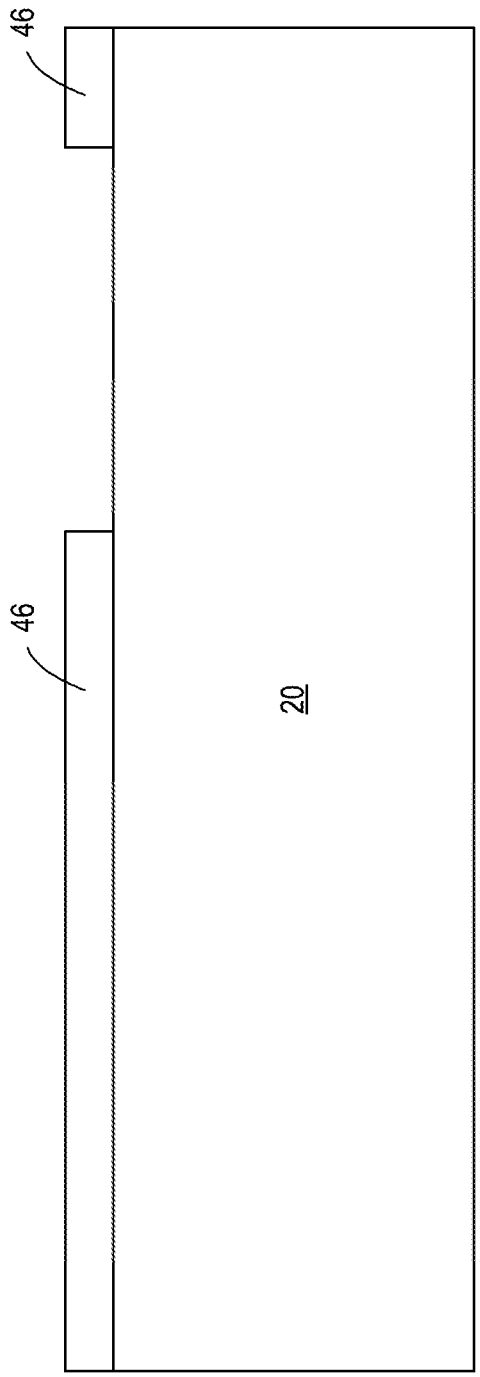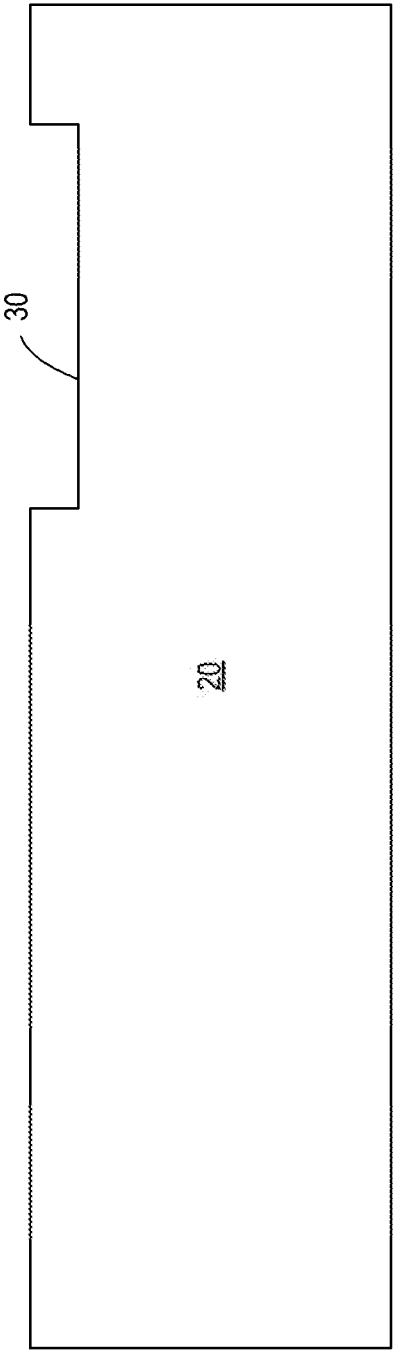

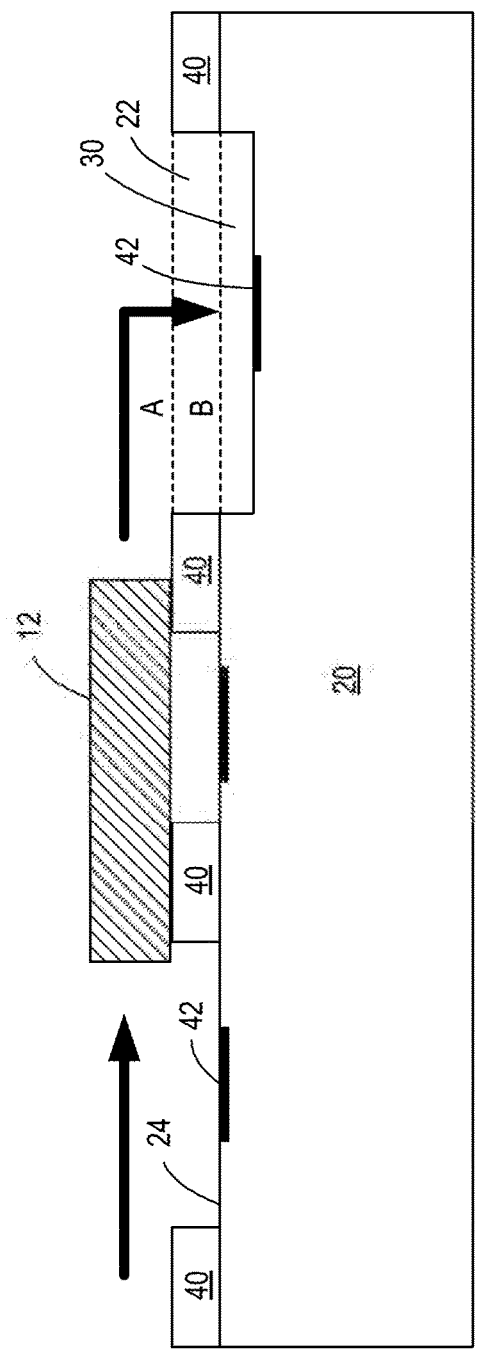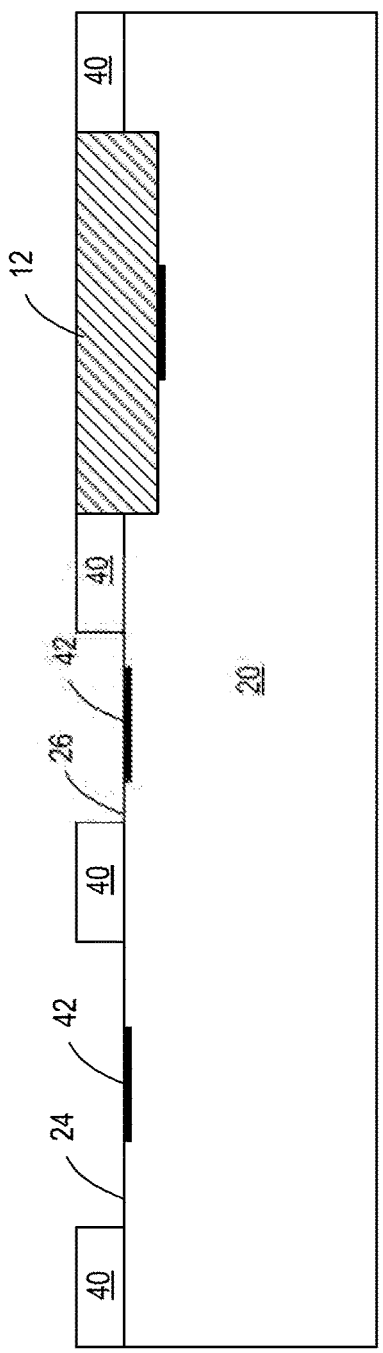

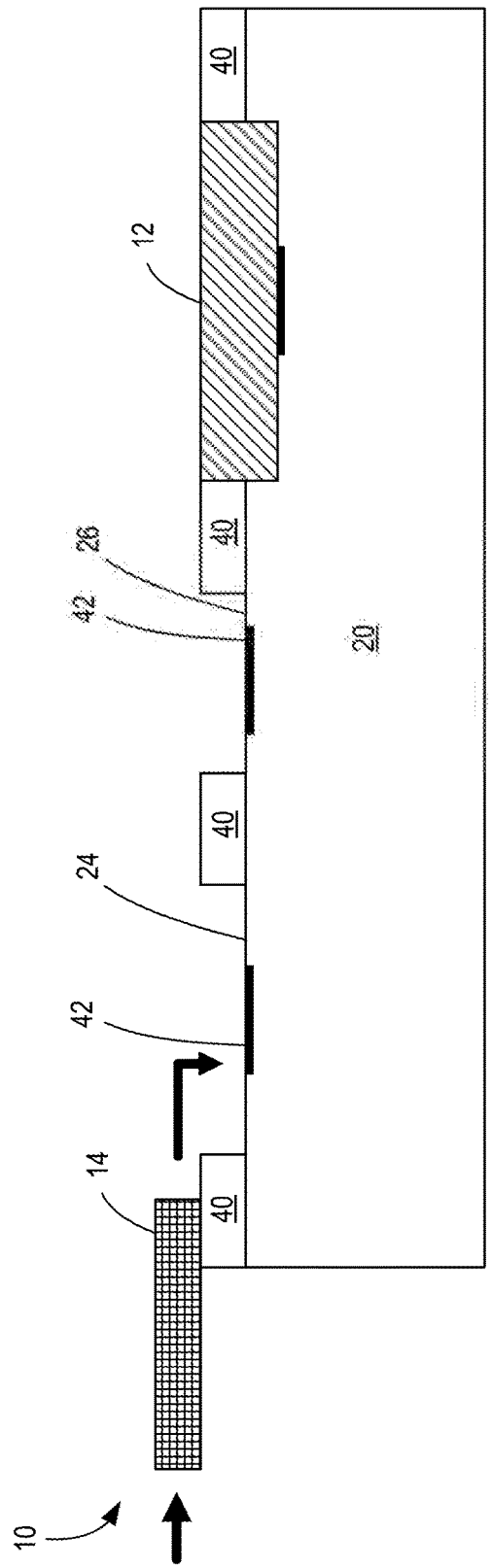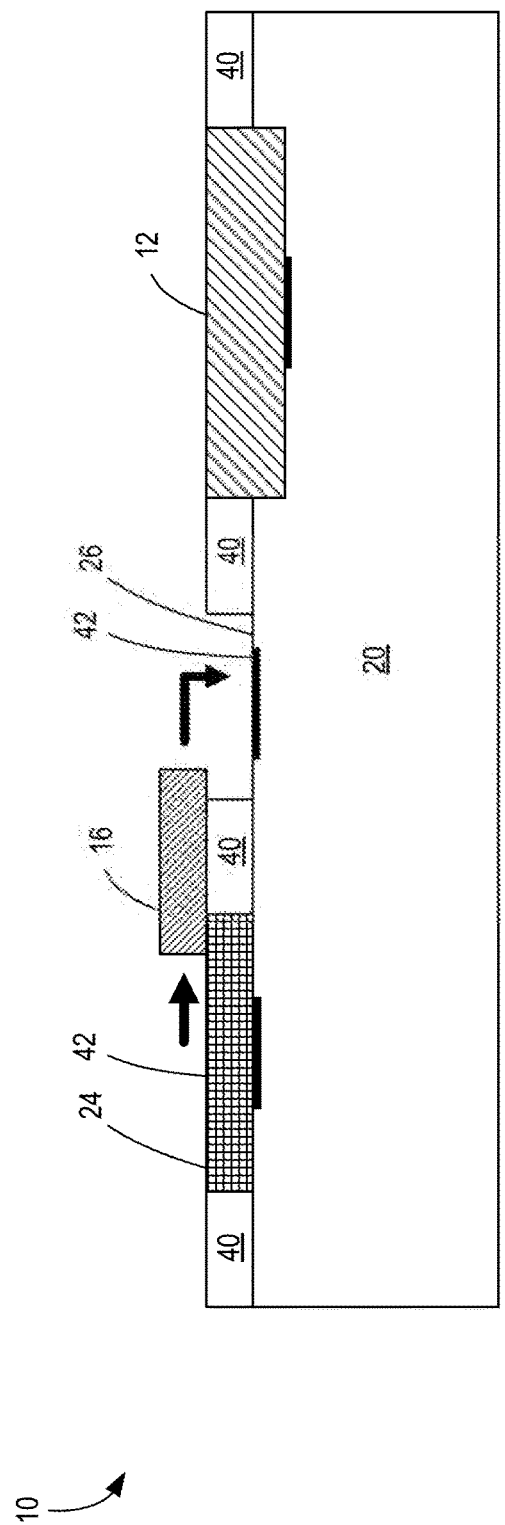

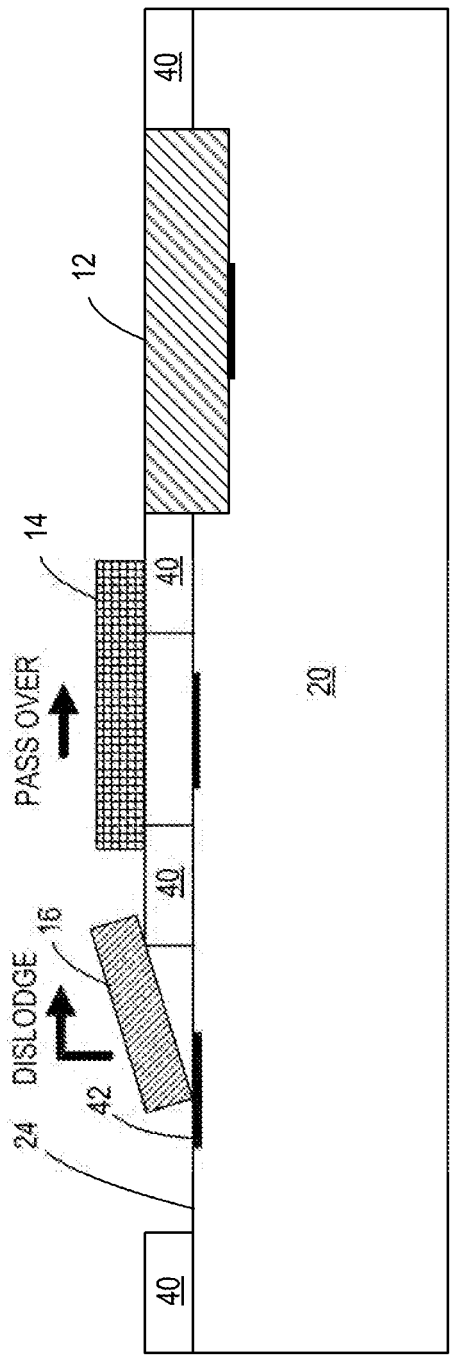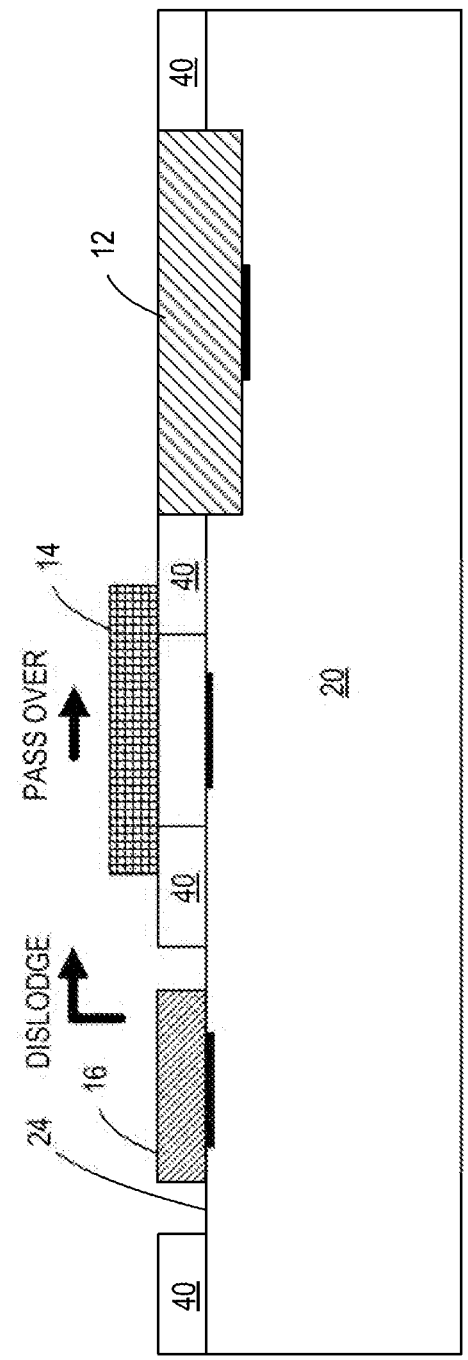

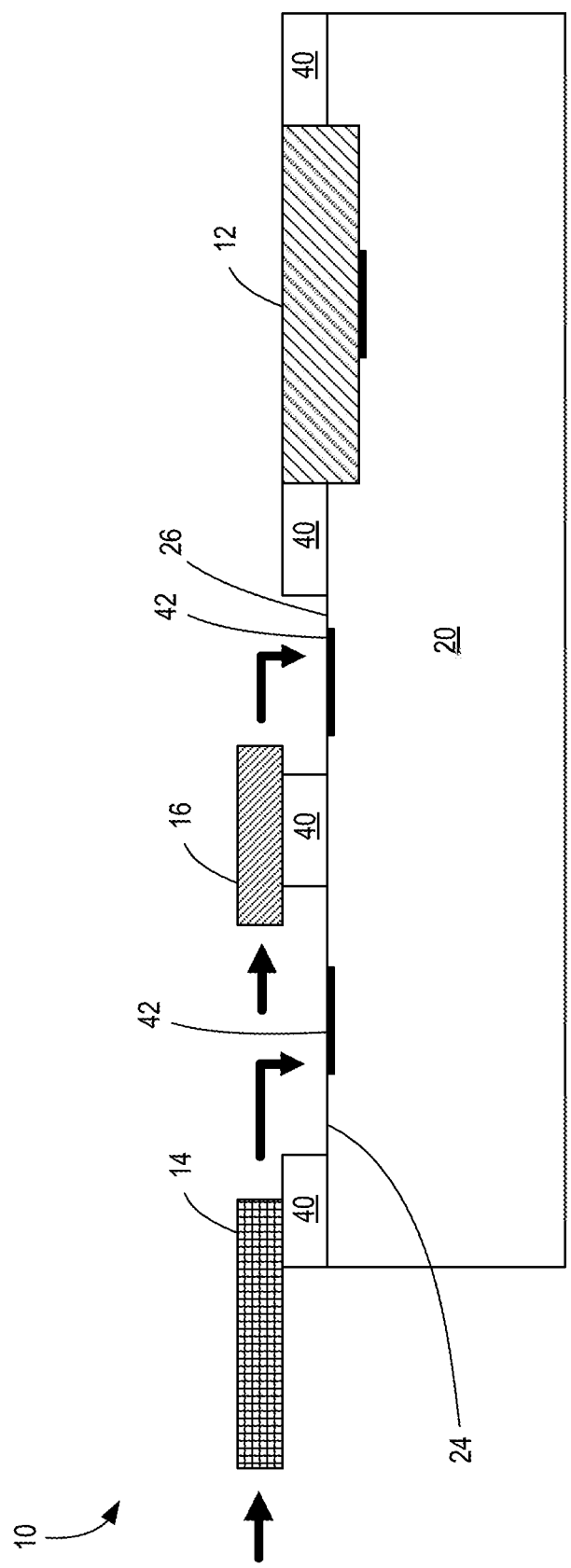

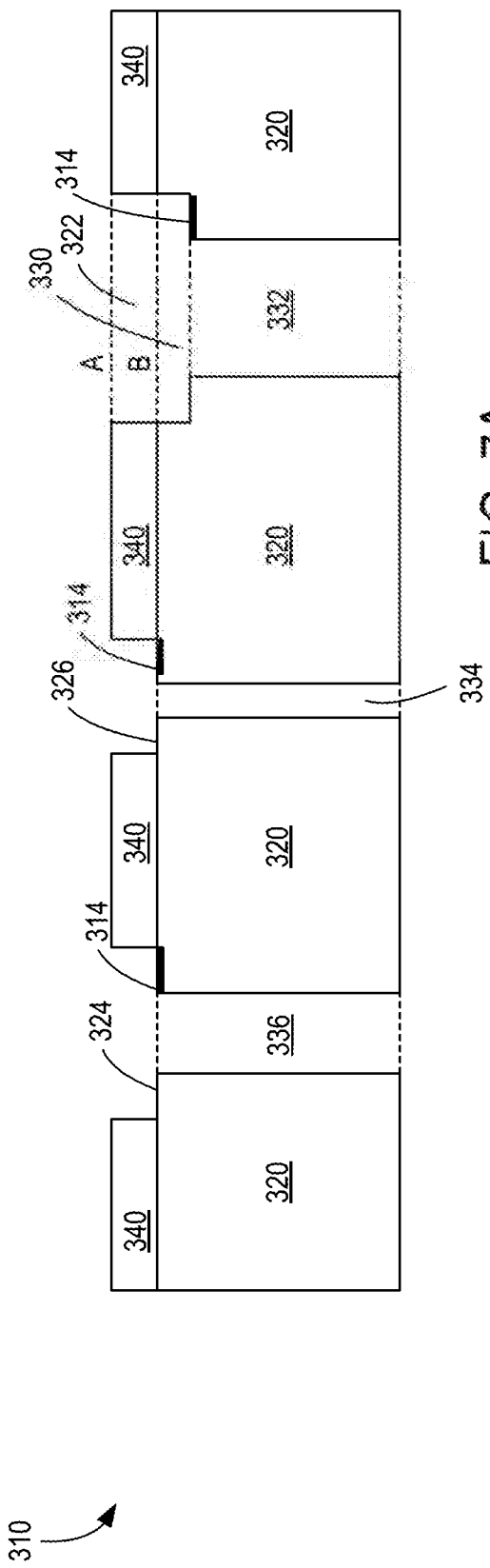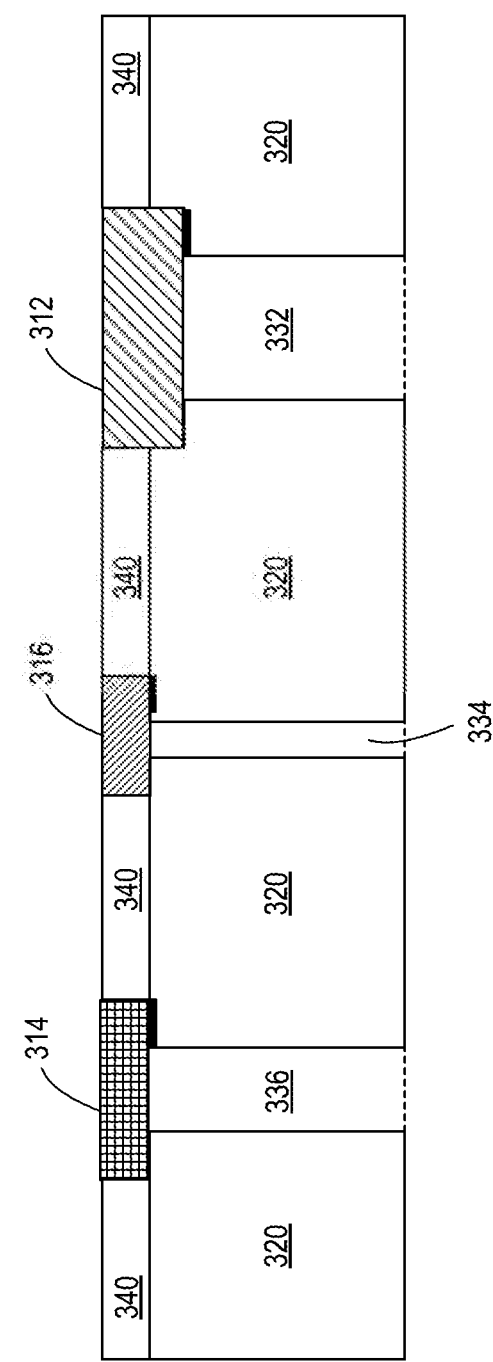

LIGHT EMITTING DEVICE AND FLUIDIC MANUFACTURE THEREOF

RELATED APPLICATIONS

This application is a continuation of U.S. patent application Ser. No. 16/268,416 entitled "LIGHT EMITTING DEVICE AND FLUIDIC MANUFACTURE THEREOF", and filed by Sasaki et al. on Feb. 5, 2019; which is a continuation of U.S. patent application Ser. No. 10/230,020 entitled "LIGHT EMITTING DEVICE AND FLUIDIC MANUFACTURE THEREOF", and filed by Sasaki et al. on Jul. 14, 2017, which in turn is a division of U.S. Pat. No. 9,722,145 entitled "LIGHT EMITTING DEVICE AND FLUIDIC MANUFACTURE THEREOF", and filed by Sasaki et al. on Jun. 24, 2015.

BACKGROUND

Light emitting devices (LEDs) are anticipated to be used in future high-efficiency lighting applications, such as displays and lights. Recently, micro LEDs have been developed for future high-efficiency lighting applications. One challenge associated with such devices is that the assembly of micro-scale components can be costly and complicated, making it difficult to achieve high assembly accuracy at a reasonable manufacturing cost.

Methods for the distribution or alignment of small devices onto a transparent substrate, such as glass or a polymer, to create light emitting devices are well known in the art. One cost-effective method is fluidic self-assembly, in which a liquid carrier medium of an ink or slurry is filled with small lighting devices, and allowed to flow over the substrate. The small lighting devices are carried across the substrate by fluid transport, and gravity is used to mechanically trap the small lighting devices in mechanical trapping sites on the substrate in the manufacturing process. However, in conventional fluidic self-assembly methods, when small devices with different sizes are trapped in trapping sites, the devices are often misaligned or disposed in the incorrect sites. Moreover, even when the devices are correctly aligned and disposed in the correct sites, the resulting surface of the light emitting device may not be planar, requiring a polishing step after assembly, which compromises the cost-effectiveness of the manufacturing process, and in some cases can undesirably alter the precise positioning of the small lighting devices.

SUMMARY

To address the above issues, light emitting devices and methods for their manufacture are provided. According to one aspect, a light emitting device is provided that comprises a substrate having a recess, and an interlayer dielectric layer located on the substrate. The interlayer dielectric layer may have a first hole and a second hole, the first hole opening over the recess of the substrate. The light emitting device may further include a first and second micro light emitting device, the first micro light emitting device having a thickness greater than a second micro light emitting device. The first micro light emitting device and the second micro light emitting device may be placed in the first hole and the second hole, respectively.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The present disclosure is illustrated by way of example and not by way of limitation in the figures of the accompanying drawings, in which the like reference numerals indicate like elements.

FIGS. 4A-H show an overview of the process for producing a light emitting device in accordance with the first embodiment of the present invention.

FIGS. 5A-B show schematic diagrams of a self-alignment process for producing a light emitting device in accordance with the first embodiment of the present invention.

FIG. 6 shows an overview of a modified process for producing a light emitting device in accordance with the first embodiment of the present invention.

FIGS. 7A-B show schematic diagrams of a light emitting device according to a fourth embodiment of the present invention.

DETAILED DESCRIPTION

Selected embodiments of the present invention will now be described with reference to the accompanying drawings. It will be apparent to those skilled in the art from this disclosure that the following descriptions of the embodiments of the invention are provided for illustration only and not for the purpose of limiting the invention as defined by the appended claims and their equivalents.

Figure 1A:
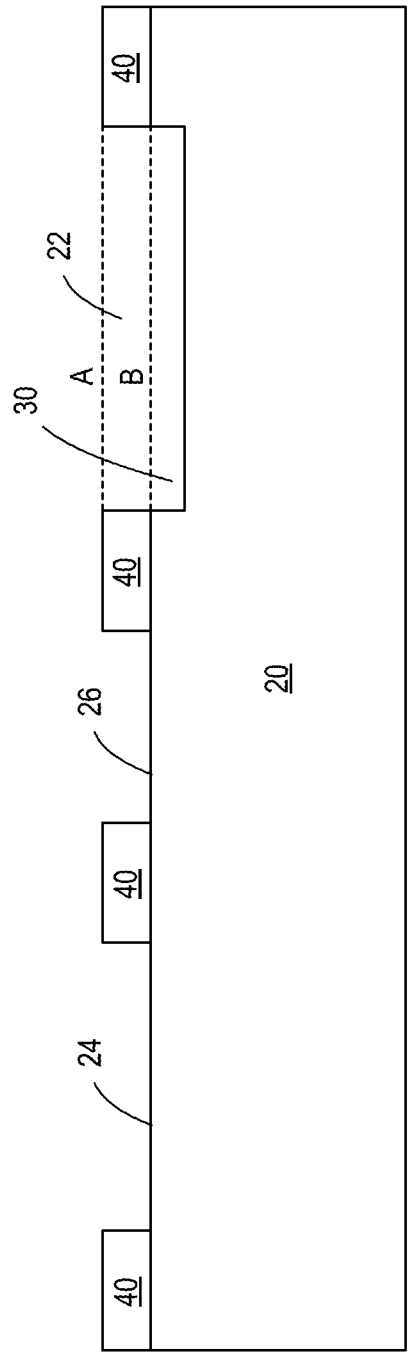
FIGS. 1A-B show schematic diagrams of a light emitting device according to a first embodiment of the present invention.

Referring initially to FIG. 1A, a light emitting device 10 is provided according to the first embodiment of the present invention. FIG. 1A shows a cross-sectional view of a light emitting device 10 (referred to alternatively herein as "LED"). The light emitting device 10 comprises a substrate 20 having a recess 30, an interlayer dielectric layer 40 being located on the substrate 20, and having a first hole 22 and a second hole 24, the first hole 22 opening over the recess 30 of the substrate 20 so as to communicate with the recess 30. The light emitting device 10 may further comprise a third hole 26 in the interlayer dielectric layer 40 having a different size from the second hole 24. Typically, the first hole 22, second hole 24, and third hole 26 have different sizes from each other. Numerous shapes are possible for the cross sections of the holes, and numerous dimensions are possible for the different sizes of the holes. In one specific example, the first hole 22, second hole 24, and third hole 26 may be configured in circular shapes with diameters of between 95 and 115 µm, between 70 and 90 µm, and between 45 and 65 µm, respectively. And, in one more specific example the respective dimensions may be 105 µm, 80 µm, and 55 µm.

Typically, the effective diameter of the holes are sized to be a few microns (e.g., 1-6 µm, and more typically 3 µm) larger than the corresponding micro LEDs to allow the micro LEDs to fit within the holes without being too easily dislodged. With this configuration, the holes are configured to mechanically trap micro LEDs of different sizes during fluid transport in the manufacturing process, as explained in more detail below.

In FIG. 1A, the first hole 22 is delineated on the top and bottom by dotted lines A and B, respectively, and the recess 30 is delineated on the top by dotted line B. Dotted line A represents an imaginary plane that extends over the first hole 22 along the plane of the upper surface of the interlayer dielectric layer 40, while dotted line B represents an imaginary plane delineating the boundary between the first recess 30 and the first hole 22, extending over the first recess 30 along the plane of the upper surface of the substrate 20. In the depicted embodiment, the depth of the recess 30 is configured to be substantially equal to a thickness of the interlayer dielectric layer 40, although it will be appreciated that other configurations are possible and the recess 30 may be shallower or deeper than the thickness of the interlayer dielectric layer 40, with the total thickness of the recess 30 and first hole 22 being selected to match the thickness of a corresponding micro LED, as described below. Accordingly, a trapping site is created that can selectively trap larger devices. The first hole 22, second hole 24, and third hole 26 may be configured with thicknesses that are substantially equal to the thickness of the interlayer dielectric layer 40. In an example configuration, the thickness of the interlayer dielectric layer 40 may be selected to be between 0.1 and 100 µm, and more specifically may be selected to be between 1 and 50 µm, and in one particular embodiment may be 5 µm. In FIG. 1A, it will be appreciated that the micro LEDs have been removed for illustrative purposes.

The recess 30 is provided on the upper surface of the substrate 20, which is preferably a transparent substrate that may comprise or be formed of a plastic, polymer (polyimide, for example), or glass (perforated glass, quartz glass, or sapphire glass, for example). The transparent substrate may alternatively be a laminated sheet comprising a substrate having two layers. A depth of the recess 30 is typically selected to be between 0.1 and 100 µm, and more specifically may be between 1 and 50 µm, and in one particular embodiment may be 5 µm. The recess 30 may be configured in a shape and dimension that corresponds to the first hole 22, which in one specific example may be a circular shape with a diameter of between 95 and 115 µm, or more specifically of 105 µm. Alternatively, the recesses 30 could be embossed or etched to have different depths on the same substrate 20 to accommodate micro LED devices of different depths.

The interlayer dielectric layer 40, typically located on the upper surface of the substrate 20, comprises a polymeric material such as an acrylic resin or a polyimide resin in this embodiment, but may also comprise a silicon nitride (SiNx) or a silicon oxide (SiO) instead. A thickness of the interlayer dielectric layer 40 may be configured to range between 0.1 and 100 µm, and more specifically between 1 and 50 µm.

Figure 1B:
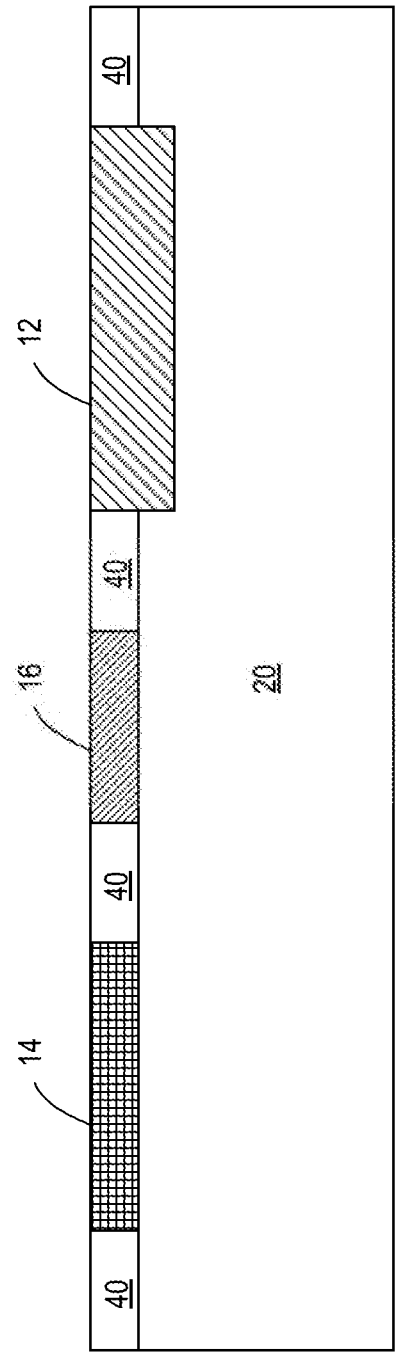

Referring to FIG. 1B, the micro LEDs are depicted in the holes and recess 30 to illustrate the final assembly of the light emitting device 10. A first micro LED 12 has a thickness greater than a second micro LED 14 and is placed in the first hole 22, and the second micro LED 14 is located in the second hole 24. A third micro LED 16 may be located in the third hole 26 and may have a different size from the second micro LED 14. The first micro LED 12 and second micro LED 14 may be provided on the light emitting device 10, such that an upper surface of the interlayer dielectric layer 40, an upper surface of the first micro LED 12, and an upper surface of the second micro LED 14 are substantially level, obviating the need to planarize the upper surface of the light emitting device 10 following assembly by using a polishing process, such as CMP, or by adding additional layers, etc. In this manner, cover layers such as optical films, etc., may be easily manufactured on a level surface over the light emitting device 10. The first hole 22 and second hole 24 are respectively configured to be slightly larger than their corresponding microLEDs, namely, first micro LED 12 and second micro LED 14. For example, the diameters of the micro LEDs are configured so that the first hole 22, second hole 24, and third hole 26 have diameters that are a predetermined distance, such as 5 µm, larger than the first micro LED 12, second micro LED 14, and third micro LED 16, respectively, allowing the micro LEDs to easily settle into their respective holes during fluidic transport assembly, as described below. Alternatively, in another embodiment, the upper surfaces of the first micro LED 12, second micro LED 14, and third micro LED 16 may be lower than the upper surface of the interlayer dielectric layer 40, and a subsequent planarization process may be applied, if desired, to planarize the upper surface of the assembly, for example, by adding material on top of the microLEDs or by removing material on the upper surface of the interlayer dielectric layer 40.

Like the holes 22, 24, 26 described above, it will be appreciated that the first micro LED 12, the second micro LED 14, and the third micro LED 16 also have different sizes, and these different sizes may be expressed in terms of the differences in their respective upper surface areas. For example, an area of the upper surface of the first micro LED 12 is larger than an area of the upper surface of the second micro LED 14, and which in turn is larger than an area of the upper surface of the third micro LED 16. As an example of the degree to which the upper surfaces areas may vary, the area of the upper surface of the second micro LED 14 and the corresponding upper opening of the second hole 24 may be at least 1.2 times larger than the upper surface of the third micro LED 16 and the corresponding upper opening of the third hole 26, and more specifically may be over 1.5 times larger. It will be appreciated that it is desirable to obtain uniform perceived brightness among the micro LEDs, and accordingly these exemplary differences in dimensions are based upon differences in the emissions intensities in each type of micro LED, and also account for manufacturing process margins, cost, and other factors. Regarding the shape of the microLEDs, in the depicted embodiment, the micro LEDs are configured in cylindrical shapes. In one particular arrangement, the first micro LED 12 may have a 100 µm diameter, the second micro LED 14 may have a 75 µm diameter, and the third micro LED 16 may have a 50 µm diameter. It will be appreciated, however, that the diameters may range between 1 and 1000 µm. It will be appreciated that due to the size differences described above, the micro LEDs can be self-assembled through fluidic transport in successive waves in which the largest type of micro LED is first transported and fills up available sites, the next largest type of micro LED is next transported and fills up available mid-sized sites, and finally the smallest type of micro LED is transported and fills the remaining sites, to achieve a planar upper surface on the light emitting device 10 with substantially all sites filled, without requiring the use of polishing methods, such as CMP, or additive leveling methods after assembly.

The first micro LED 12, second micro LED 14, and third micro LED 16 may be configured to emit red, green, and blue light, respectively, and together may function as a pixel that emits blended light of a desired color and intensity. The red micro LED generally may be gallium arsenide based, and as a result may be thicker than the blue and green micro LEDs, which may be gallium nitride based. The red micro LED typically has a weaker emission intensity per unit area, so the red micro LED is may be configured to have a larger emission area to compensate and thereby achieve similar emission intensities as the other micro LEDs. In this way, the thicknesses and areas of the micro LEDs may vary. As example thicknesses, the thickness of the first micro LED 12 may be greater than the thicknesses of the second micro LED 14 and the third micro LED 16, respectively. In one particular embodiment, the first micro LED 12 may have a 10 µm thickness, the second micro LED 14 may have a 5 µm thickness, and the third micro LED 16 may have a 5 µm thickness, although variations of these thicknesses are possible. This particular configuration of the thicknesses allows the upper surface of the interlayer dielectric layer 40 and the upper surfaces of the first micro LED 12, second micro LED 14, and third micro LED 16 to be substantially level without the need to apply a polishing process, such as a CMP process, to planarize the upper surface of the light emitting device 10.

The first micro LED 12, second micro LED 14, and third micro LED 16 have upper surfaces configured as light emitting faces emitting known peak spectra, and back surfaces configured as connecting electrodes. For example, the first micro LED 12 may comprise aluminum gallium indium phosphide (AlGaInP) with a peak spectrum of 630 nm (red), the second micro LED 14 may comprise indium gallium nitride (InGaN) with a peak spectrum of 517 nm (green), and the third micro LED 13 may comprise gallium nitride (GaN) with a peak spectrum of 460 nm (blue).

By providing such a light emitting device 10 as shown in the first embodiment, which includes the recess 30 of the substrate 20, and the interlayer dielectric layer 40 having a first hole 22 and a second hole 24, the first hole 22 opening over the recess 30 of the substrate 20, a first micro LED 12 having a thickness greater than a second micro LED 14, and the first micro LED 12 and the second micro LED 14 being placed in the first hole 22 and the second hole 24, respectively, LEDs of different thickness may be easily and surely positioned on the substrate 20, so that a planar upper surface is achieved on the light emitting device 10 without the use of polishing methods after assembly, such as CMP, or additive leveling.

Figure 2:
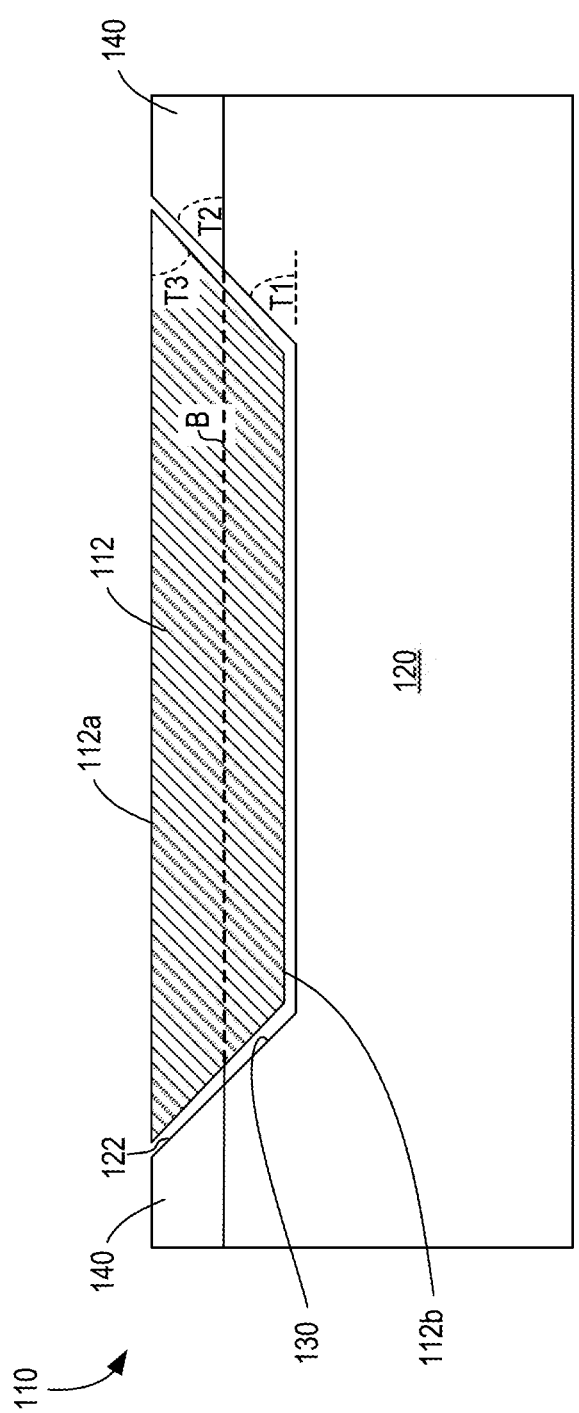
FIG. 2 shows a schematic diagram of a light emitting device according to a second embodiment of the present invention.

Referring to FIG. 2, a light emitting device 110 is provided according to the second embodiment of the present invention. FIG. 2 shows a magnified, cross-sectional view of a light emitting device 110 in the vicinity of the first micro LED 112. In the light emitting device 110 of the second embodiment, the recess 130 of the substrate 120 may have a tapered shape, as viewed in cross section, and the first hole 122 in the interlayer dielectric layer 140 also has a tapered shape as viewed in cross section. In FIGS. 2, T1 and T2 are the taper angles, relative to horizontal, of the recess 130 and first hole 122 respectively. T3 is the taper angle, relative to horizontal, of the first micro LED 112. In the depicted embodiment, T3 is the same as T1 and T2, but it will be appreciated that T3 may differ from T1 and/or T1. For example, the recess 130 and the first hole 122 may be tapered at a 30 to 60 degree angle relative to a horizontal orientation, such that angles T1 and T2 are formed at angles between 30 and 60 degrees. In a more specific embodiment, the angles T1 and T2 may be formed at 45 degrees, as depicted. While T1 and T2 are illustrated as being the same value in the depicted embodiment, it will be appreciated that each of T1 and T2 may be a different angle that is formed within the range of 30 to 60 degrees, for example. In one specific alternative embodiment, the first hole 122 in the interlayer dielectric layer 140 has no taper (T2=90 degrees) while the recess is tapered such that T1 is between 70 and 85 degrees, and the first micro LED 112 has a taper of between 70 and 85 degrees such that T1=T3. The tapered structures help orient electrodes and micro LEDs to align properly as the micro LEDs are fluidically transported over the holes, and settle into the holes under the influence of gravity.

Although only illustrated as a cross section in FIG. 2, it will be appreciated that the shape of the first micro LED 112 may be a disc shape or a polygonal shape such as an octagon or hexagon, and have tapered sides that are configured similarly to the tapered recess and hole described above. Due to the tapered sides, an area of the lighting surface 112a (i.e., upper surface) is larger than an area of an electrode surface 112b (i.e., bottom surface) of the first micro LED 112. Thus, the first micro LED 112, located in the first hole 122 and recess 130, is configured in a shape that allows it to fit easily into the first hole 122 and the recess 130. While only a single tapered hole 122 and single tapered micro LED 112 are shown in the light emitting device 110 of FIG. 2, it will be appreciated that this is for illustrative purposes to describe the possibility of tapered sides, and that all or a selected plurality of the holes, recesses, and micro LEDs in the other embodiments described herein may be formed with a taper similar to that shown in FIG. 2 to encompass various permutations, including an embodiment where only the holes are tapered and the micro LEDs are not tapered. Thus, a second micro LED and a third micro LED, and their corresponding holes, described below, may have a similar structure as the first micro LED 112. The disc-shape or polygon-shape described above aids in inhibiting the micro LEDs from aggregating together as a mass during fluid transport of the micro LEDs during the manufacturing process, thereby promoting their distribution across an entire substrate and quick settling into the holes distributed across the substrate.

Figure 3A:
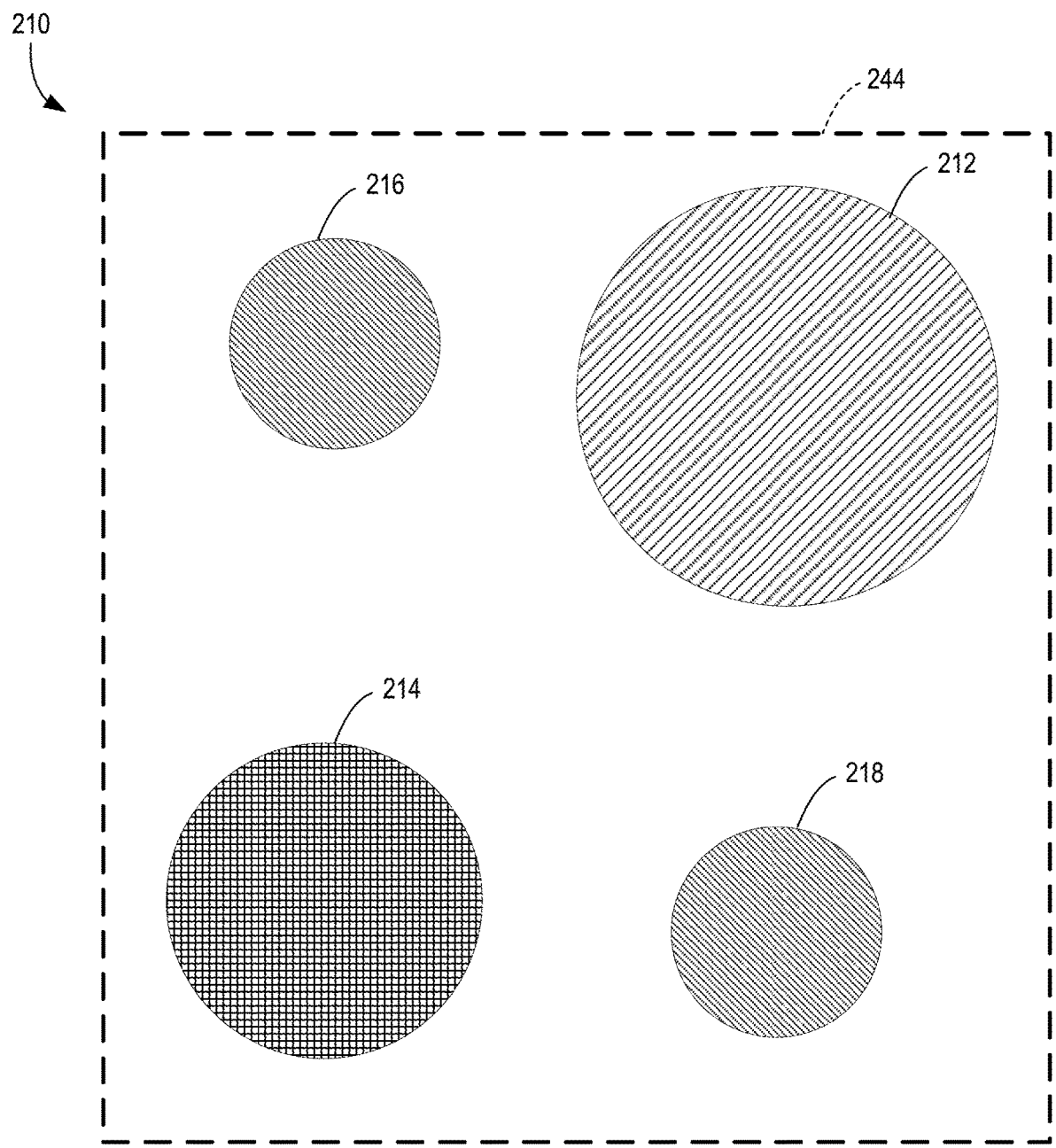
FIGS. 3A-B show schematic diagrams of a light emitting device according to a third embodiment of the present invention.

Referring to FIG. 3A, a top plan view of a dot-pattern area 244 of a light emitting device 210 of the third embodiment is illustrated, which may also be referred to as a pixel. It will be appreciated that the light emitting device 210 may comprise a plurality of such dot patterns as embodied by the dot-pattern area 244, for example arranged in rows and columns as a grid or other repeating pattern as a display, television, ceiling light, car light, etc. The light emitting device 210 of this embodiment has four micro LEDs configured within the dot-pattern area 244, comprising the first micro LED 212 which is configured to emit red light, the second micro LED 214 which is configured to emit green light, the third micro LED 216 which is configured to emit blue light, and a fourth micro LED 218 which is also configured to emit blue light. The configuration of two blue micro LEDs in the dot-pattern area 244 is intended to improve the color gamut by accounting for the fact that spectral sensitivity in humans is generally weaker at shorter wavelengths (in humans, spectral sensitivity is identified at three peaks roughly corresponding to red, green, and blue, respectively; the strongest peak is green, followed by red and blue). The third micro LED 216 and fourth micro LED 218 may not necessary have the same peak spectrum. For example, the third micro LED 216 may comprise GaN with a peak spectrum of 450 nm, and the fourth micro LED 218 may comprise GaN with a peak spectrum of 470 nm.

Like the first embodiment, the four micro LEDs depicted in FIG. 3A are configured in cylindrical shapes, although other shapes may be used. In one specific example, the first micro LED 212 may have a diameter between 90 and 110 µm, such as 100 µm, the second micro LED 214 may have a diameter between 65 and 85 µm, such as 75 µm, and the third and fourth micro LEDs 216, 218 may have a diameter between 40 and 60, such as 50 µm, for example. As discussed above, the red micro LED is often configured to be thicker than the green or blue micro LEDs due to its constituent materials. Thus, the thickness of the first micro LED 212 is typically configured to be thicker than the second, third, and fourth micro LEDs 214, 216, 218. Thus, in one specific example, the first micro LED 212 may have a thickness between 8 and 12 µm, such as 10 µm, the second micro LED 214 may have a thickness between 4 and 6 µm, such as 5 µm, and the third and fourth micro LEDs 216, 218 may have a thickness between 4 and 6 µm, such as 5 µm.

Figure 3B:
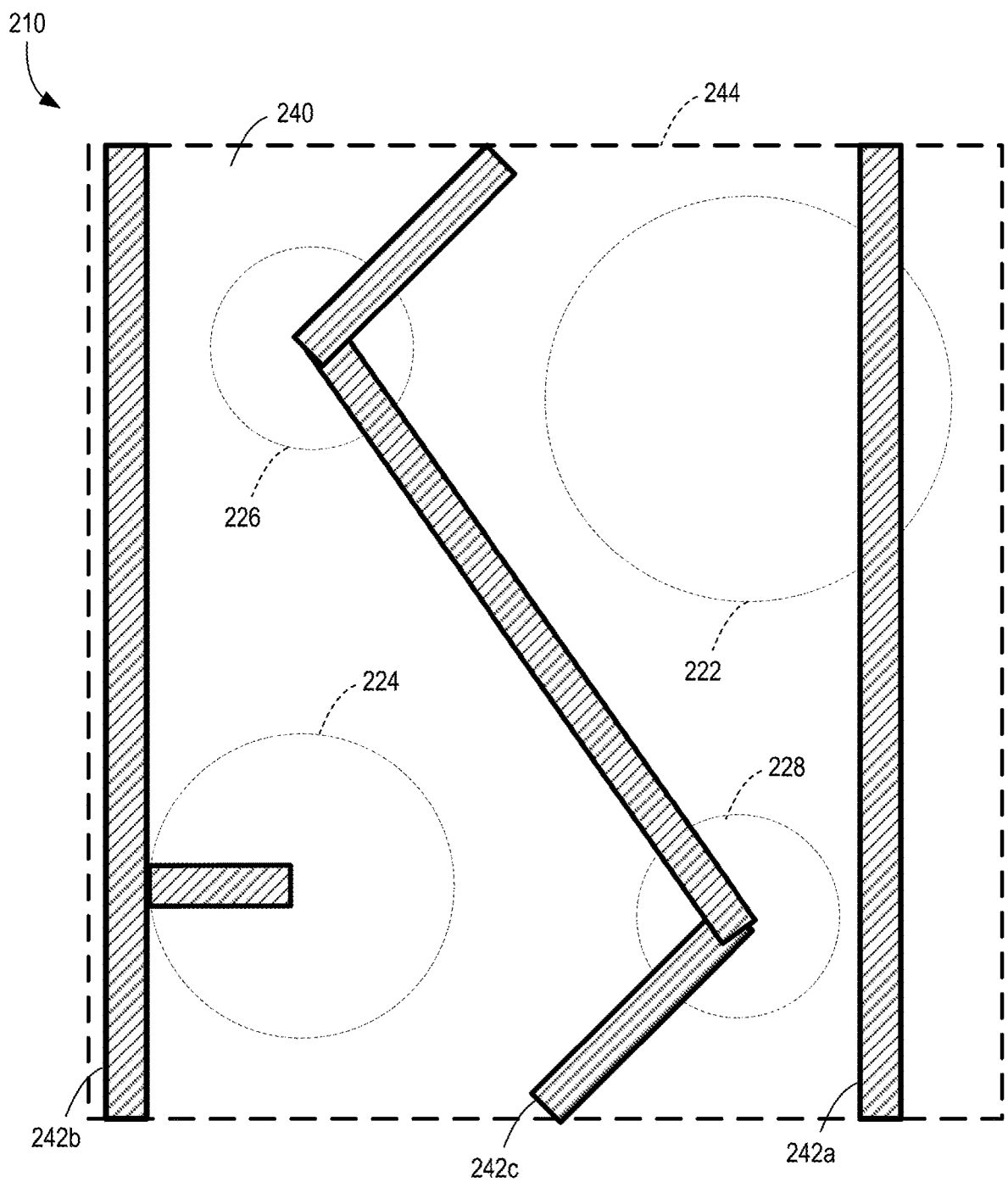

Referring to FIG. 3B, a top plan view of the electrodes 242a, 242b, and 242c in the dot-pattern area 244 of the light emitting device 210 is illustrated. The micro LEDs have been removed in this drawing for illustrative purposes. The first hole 222, second hole 224, third hole 226, and fourth hole 228 are located in the interlayer dielectric layer 240. The first electrode 242a is configured to electrically contact an electrode surface of the first micro LED 212 placed in the first hole 222, the second electrode 242b is configured to electrically contact an electrode surface of the second micro LED 214 placed in the second hole 224, and the third electrode 242c is configured to electrically contact electrode surfaces of both the third micro LED 216 placed in the third hole 226 and fourth micro LED 218 placed in the fourth hole 228. The first electrode 242a, second electrode 242b, and third electrode 242c do not intersect each other. The third electrode 14c is shaped in a zigzag pattern to avoid contact with the first micro LED 212 or the second micro LED 214 and their respective electrodes.

In this embodiment, the interlayer dielectric layer 240 not only isolates the electrodes 242a, 242b, and 242c for the micro LEDs, but also provides holes that serve to selectively trap disposed devices while excluding larger devices. Solder or eutectic contact may be relied upon to ensure good electrical contact between the electrodes and the disposed devices. Solder may also be liquid during assembly and provide capillary force interaction with devices to aid in trapping.

Figure 3C:
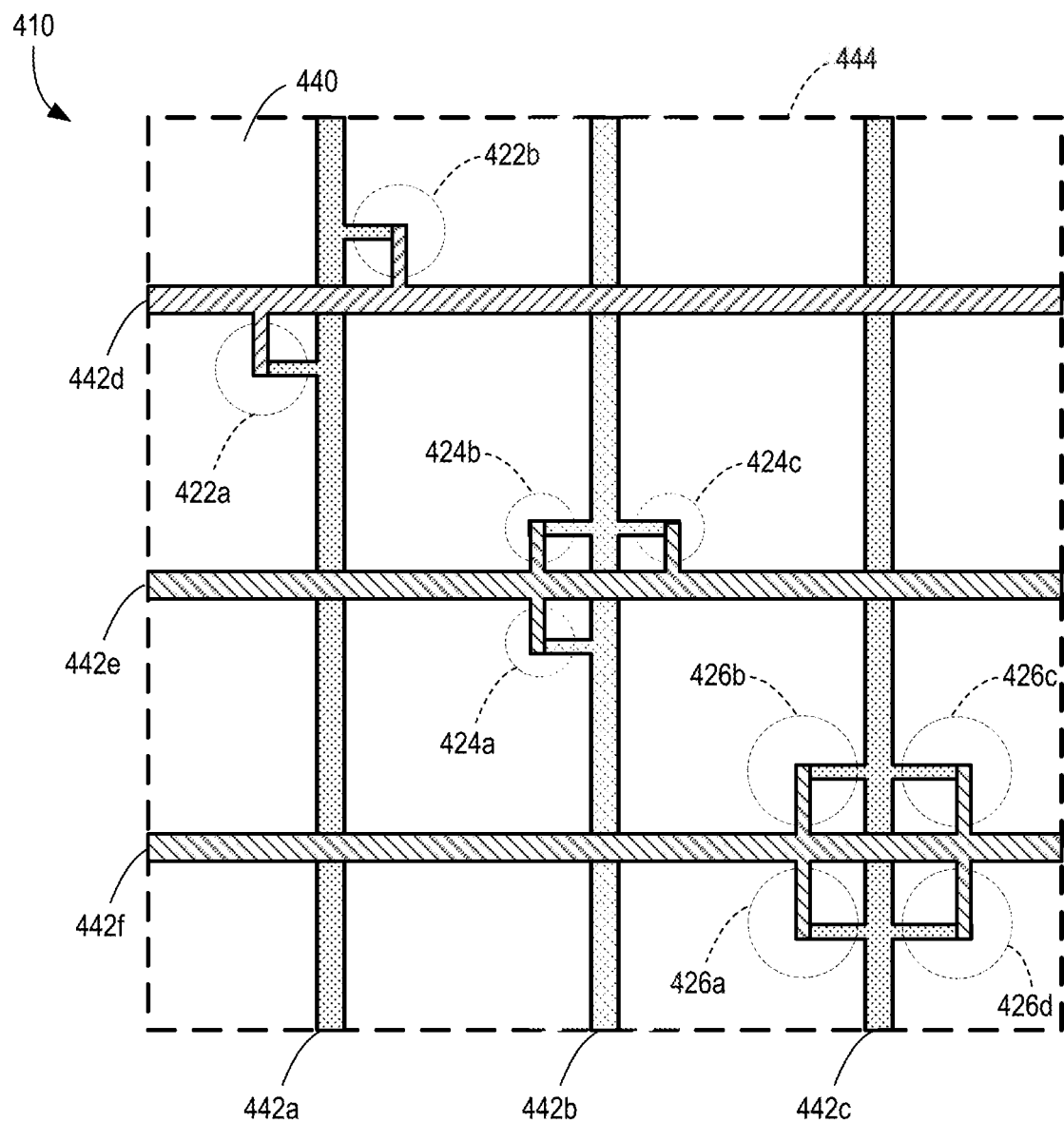
FIG. 3C shows a schematic diagram of a light emitting device according to a fifth embodiment of the present invention.

Referring to FIG. 3C, a top plan view of a dot-pattern area 444 (i.e., a pixel) of a light emitting device 410 of the fifth embodiment is illustrated, in which the sizes of each of the holes formed therein for the associated micro LEDs have been adjusted as compared to the embodiment of FIGS. 3A and 3B to account for human spectral sensitivity. As with the third embodiment, it will be appreciated that the light emitting device 410 may comprise a plurality of such dot patterns as embodied by the dot pattern area 444. The micro LEDs have been removed in this drawing for illustrative purposes. The first holes 422a-b, second holes 424a-c, and third holes 426a-d are located in the interlayer dielectric layer 440. The first top lead electrode 442d and first bottom lead electrode 442a are configured to electrically contact electrode surfaces of the red micro LEDs that are placed in the first holes 422a-b, thereby forming the red sub-pixel. The second top lead electrode 442e and second bottom lead electrode 442b are configured to electrically contact electrode surfaces of the green micro LEDs that are placed in the second holes 424a-c, thereby forming the green sub-pixel. The third top lead electrode 442f and third bottom lead electrode is 442a are configured to electrically contact electrode surfaces of the blue micro LEDs that are placed in the third holes 426a-d, thereby forming the blue sub-pixel. The top lead electrodes 442d-f and bottom lead electrodes 442a-c do not form electrical connections where they intersect each other, but electrically contact the micro LEDs. It will be appreciated that each micro LED is configured with two electrical leads: one to electrically connect with a top lead electrode and another to electrically connect with a bottom lead electrode. In this embodiment, the first micro LEDs placed in the first holes 422a-b may have a diameter between 20 and 75 µm, such as 45 µm, the second micro LEDs placed in the second holes 424a-c may have a diameter between 40 and 100 µm, such as 70 µm, and the third micro LEDs placed in the third holes 426a-d may have a diameter between 50 and 200 µm, such as 100 µm, for example. As discussed below, it will be appreciated that during fluidic assembly, the largest diameter micro LEDs are transported a first stage to fill the largest diameter holes, followed by the second largest in a second stage, and then followed by the third largest in a third stage. The total micro LED area for all LEDs in the blue, red, and green sub-pixels may be set to have ratio of 6:3:2 (for blue:red:green). The depths for the holes 422a-b containing the red micro LEDs are typically deeper than the holes 424a-c, 426a-d for the blue and green micro LEDs, to accommodate thicker red micro LEDs, and thus of these holes only holes 422a-b have a cross sectional structure including a recess extending into the substrate, similar to recess 30 in the embodiment of FIG. 1A, discussed above. The red micro LEDs that are inserted into this embodiment are manufactured with aluminum gallium indium phosphide (AlGaInP) while the blue and green LEDs are based on gallium nitride (GaN) with different amounts of indium doping. The thicknesses of the blue and green micro LEDs are the same at about 5 µm, while the red micro LEDs are around 10 µm thick or greater. Of course, these are merely exemplary measurements, and LEDs of other dimensions may utilized. It will be appreciated that human vision on average is most sensitive to green light, followed by red light, and is least sensitive to blue light. Accordingly the size, location, and number of the micro LEDs in this embodiment have been adjusted to achieve the same or similar luminance for each color of sub-pixel, accounting for the variance in luminous intensity per unit area of the LEDs themselves and variance in human vision sensitivity to the wavelengths of red, blue and green light emitted by each sub-pixel.

FIGS. 4A-F are views in cross section illustrating manufacturing steps of an example method for producing the light emitting device 10 of FIGS. 1A-B, in accordance with the first embodiment of the present invention.

FIGS. 4A-B show the situation when the substrate 20 is formed over a base (for the sake of brevity, the base is omitted in the Figures). A resist layer 46 is deposited over the substrate 20 as a mask layer, patterned to predetermined patterns by photolithography, and etched by wet etching or embossed to form a recess 30 on the substrate 20. The depth of the recess 30 formed in the substrate 20 is configured to be substantially equal to a thickness (i.e., depth) of the first hole 22 in the interlayer dielectric layer 40. Accordingly, a trapping site that can selectively trap larger devices is created. The resist layer 46 is subsequently removed by washing or dissolution.

Figure 4C:
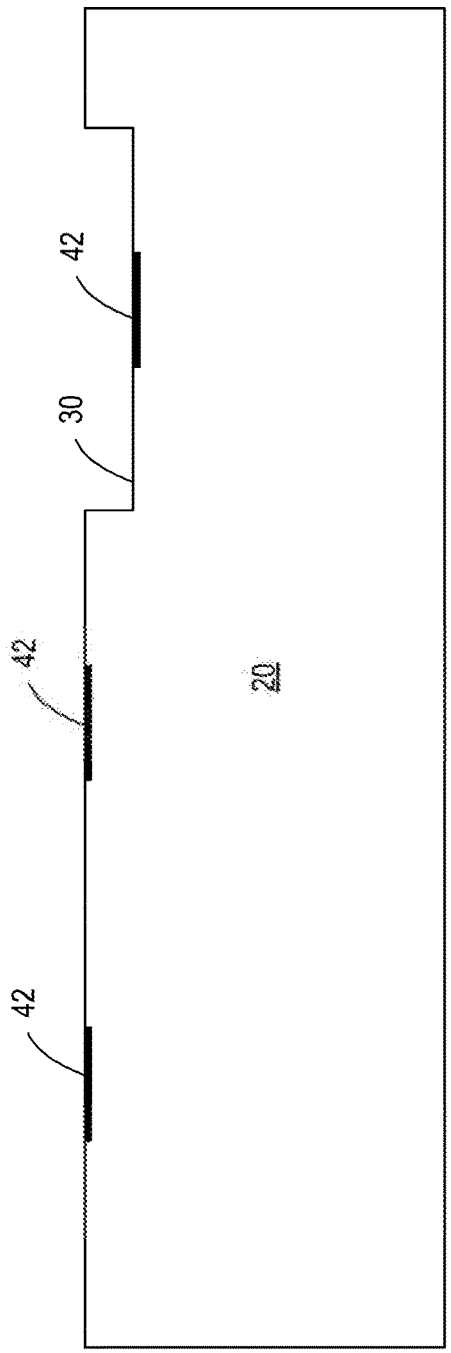

FIG. 4C shows the situation when electrodes 42 are formed on the substrate 20 with a recess 30. The electrodes

42 may comprise a metal, such as aluminum, copper, or ITO (Indium Tin Oxide). The electrodes 42 can be formed by sputtering, plating, and lift-off methods, for example. The electrodes 42 make electrical connections with the electrode surfaces of the micro LEDs that are correctly disposed and aligned inside their respective holes. It will be appreciated that the electrodes 42 are configured to be thin relative to the micro LEDs, so that the thickness of the electrodes 42 does not interfere with the disposition and alignment of the micro LEDs inside their respective holes. To further improve the electrical connections of the electrodes 42 with the electrode surfaces of the micro LEDs, the electrodes 42 may be formed within dedicated recesses that are provided in the substrate 20.

Figure 4D:
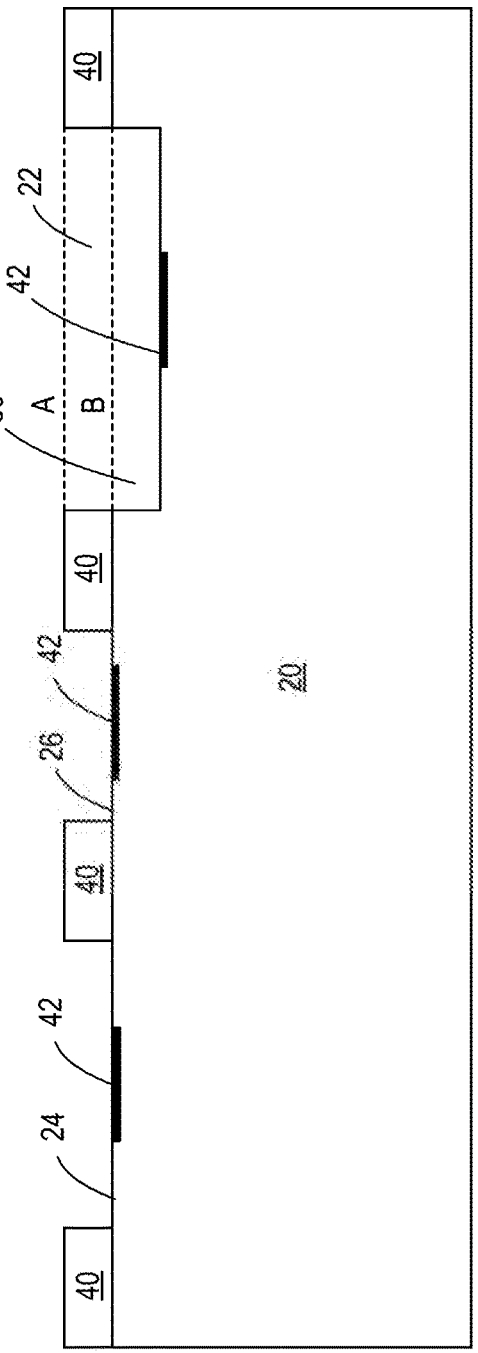

FIG. 4D, shows the situation when the interlayer dielectric layer 40 is provided over the substrate 20. A first hole 22 is created in the interlayer dielectric layer 40, opening over the recess 30 of the substrate 20, exposing at least a part of the electrode 42. A second hole 24 and third hole 26 are created in the interlayer dielectric layer 40 at predetermined positions, exposing at least a part of the electrodes 42. The interlayer dielectric layer 40 may comprise photosensitive resin, which may be separately deposited onto the substrate 20 or manufactured from a portion of the substrate 20 through a treatment process.

FIGS. 4E-F depict the first fluid transport stage. It will be appreciated that larger, heavier devices are generally fluidically transported in the first fluid transport stage, while smaller, lighter devices are fluidically transported in subsequent stages with larger devices filling larger trapping sites first and passing over smaller empty trapping sites, and smaller devices subsequently filling smaller trapping sites. In the first fluid transport stage, the first micro LED 12 is fluidically transported to the first hole 22. The left side of the drawing represents the upstream portion of the fluid flow path, represented by the dark arrows, along which the micro LEDs are fluidically transported, while the right side of the drawing represents the downstream portion. However, it will be appreciated that the upstream portion and the downstream portion may be designated at other sites on the light emitting device 10 relative to the holes and the substrate 20. First, the first micro LED 12 is transferred into a fluid to form an ink or slurry. The slurry is then dispensed over the upper surface of the substrate 20 and the interlayer dielectric layer 40 at the upstream portion. The flow speed of the first fluid transport stage may be a sustained speed of 5 to 200 μm/sec locally at the surface during a low velocity trapping period of the first fluid transport stage, where the first micro LED 12 is disposed into the first hole 22 by gravity-driven fluid transport in a downstream direction (see FIG. 4F). The flow may also oscillate or pulse at high amplitudes (e.g., greater than 1 mm/sec) during a distribution period of the first fluid transport stage in which the LEDs are distributed across the surface, provided there is also the low-velocity trapping period during which the LEDs are allowed to settle. At high flow-entrained disc speeds (e.g., disc speeds that exceed approximately 200 μm/s), the first micro LED 12 may fail to self-align into the first hole 22 and recess 30, or other components (the second micro LED 14 or the third micro LED 16, for example) may be disposed into the first hole 22 instead of the first micro LED 12. It will be appreciated that the disc speed at which self-alignment may fail to occur is influenced by the disc and well size. Further, the relationship between the disc speed and fluid flow speed is influenced by the properties of the transport fluid. Accordingly, disc speeds ranging from 5 to 100 μm is locally at the surface improve the alignment and disposition of the first micro LED 12 in the first hole 22. It will be appreciated that the first fluid transport stage may be repeated multiple times in one manufacturing process at variable flow speeds and directions.

FIGS. 4G-H depict the second and third fluid transport stages, respectively. In the second fluid transport stage, the second micro LED 14 is fluidically transported to the second hole 24. In the third fluid transport stage, the third micro LED 16 is fluidically transported to the third hole 26. The left side of the drawing represents the upstream portion of the fluid flow path, represented by the dark arrows, along which the micro LEDs are fluidically transported, while the right side of the drawing represents the downstream portion. However, it will be appreciated that the upstream portion and the downstream portion may be designated at other sites on the light emitting device 10 relative to the holes and the substrate 20. In the second fluid transport phase, the second micro LED 14 is initially transferred into a fluid to form an ink or slurry. Likewise, in the third fluid transport phase, the third micro LED 16 is initially transferred into a fluid to form an ink or slurry. The slurry is then dispensed over the upper surface of the substrate 20 and the interlayer dielectric layer 40 at the upstream portion. It will be appreciated that the second and third fluid transport stages may be repeated multiple times in one manufacturing process at variable flow speeds and directions.

The flow speed of the second fluid transport stage may be a sustained speed of 5 to 100 μm/s during a trapping period of the second fluid transport stage, where the second micro LED 14 is disposed into the second hole 24 by fluid transport in a downstream direction, and components other than the second micro LED 14 are dislodged from the second hole 24. Higher speeds such as 1 mm/s may be used during a distribution period of the second fluid transport stage, to distribute the LEDs of that stage across the surface for settling. For example, FIG. 5A depicts a situation where fluid transport dislodges the third micro LED 16 from the second hole 24. At flow-entrained disc speeds that exceed 100 μm/s, the second micro LED 14 may fail to self-align into the second hole 24, or other components may be disposed into the second hole 24 instead of the second micro LED 14. For example, FIG. 5B depicts a situation where the third micro LED 16 is disposed in the second hole 24 instead of the second micro LED 14. Accordingly, sustained flow speeds ranging from 5 to 100 μm/s improve the alignment and disposition of the second micro LED 14 in the second hole 24, while worsening the alignment and disposition of other components in the second hole 24, especially when the slurry includes various components that are dispensed in the same transport stage. It is thought that, at certain flow speeds, sufficient turbulence is generated between the gaps within a hole in which a mismatched component is disposed so that the mismatched component is dislodged from the hole. At the same time, if a terminal portion of the mismatched component protrudes from the hole, the interruption of laminar flow along the surface of the LED could generate sufficient turbulence to exert upward force against the terminal portion of the mismatched component, thereby dislodging the component from the hole. It will be appreciated that, likewise, the third micro LED 16 is transported at a flow speed within a range (5 to 100 μm/s sustained, for example) that allows it to self-align into the third hole 26. To account for the heavier mass of the first micro LED 12 relative to the second micro LED 14 and the third micro LED 16, the flow speed of the first fluid transport stage may be configured to be faster than the flow speeds of the second and third fluid transport stages. Accordingly, the fluidic self-assembly of the first micro LED 12 is possible despite its heavier mass relative to the second micro LED 14 and third micro LED 16. It will be appreciated that other processes may be simultaneously utilized during the fluid transport stages to affect the fluid transport of the micro LEDs, such as various scattering techniques to help evenly distribute the micro LEDs during fluid transport. Following assembly, the ink or slurry is subsequently removed from the light emitting device 10 through a process such as evaporation.

By the sequential batch assembly method described above, large devices can be located in larger holes while being prevented from trapping in smaller wells. Subsequently, smaller devices can then assemble in their corresponding holes while being excluded from larger holes and smaller holes by previously assembled larger devices and size exclusion of the holes, respectively. In this manner, multiple device types may be assembled onto a single substrate with a resulting flat topology that facilitates downstream processing and integration without requiring CMP or the overuse of polymeric leveling layers, so that the use of polymers (such as polyimide) can be restricted to patterning electrical contacts, securing and protecting devices, and bridging gaps between the recesses and the micro LEDs.

FIG. 6 is a view in cross section illustrating manufacturing steps of a modified example method for producing the light emitting device 10 of FIGS. 1A-B, in accordance with the first embodiment of the present invention. Like FIGS. 4G-H, the left side of the drawing represents the upstream portion of the fluid flow path, represented by the dark arrows, along which the micro LEDs are fluidically transported, while the right side of the drawing represents the downstream portion. However, it will be appreciated that the upstream portion and the downstream portion may be designated at other sites on the light emitting device 10 relative to the holes and the substrate 20. FIG. 6 shows a modified second fluid transport stage in which the second micro LED 14 is fluidically transported to the second hole 24, and the third micro LED 16 is fluidically transported to the third hole 26. In essence, the modified second fluid transport stage combines the second fluid transport stage and the third fluid transport stage, as depicted in FIGS. 4G-H, into one stage. In the modified second fluid transport phase, the second micro LED 14 and the third micro LED 16 are initially transferred into a fluid to form an ink or slurry. The slurry is then dispensed over the upper surface of the substrate 20 and the interlayer dielectric layer 40 at the upstream portion. As described in FIGS. 4G-H, the flow speeds of the modified second fluid transport stage may be configured within a range that allows the second micro LED 14 and the third micro LED 16 to properly self-align into the second hole 24 and the third hole 26, respectively.

Referring to FIG. 7A, a light emitting device 310 is provided according to the fourth embodiment of the present invention. Since the structure of the fourth embodiment is generally similar to the first embodiment, the detailed description thereof is abbreviated here for the sake of brevity. It is to be noted that like parts are designated by like reference numerals throughout the detailed description and the accompanying drawings. FIG. 7A shows a cross-section view of a light emitting device 310. The substrate 320 of this embodiment has a first through hole 332 formed at a bottom of the recess 330 and opening to communicate with the corresponding first hole 322 opening over the recess 330 of the substrate 320. The substrate 320 also has a second through hole 334, formed at a bottom of the second hole 324 in the interlayer dielectric layer 340, which is not positioned over the recess 330. A third through hole 336 is also provided on the substrate 320, formed at a bottom of the third hole 326 in the interlayer dielectric layer 340.

The method described above for manufacturing a light emitting device may be modified, so as to manufacture the light emitting device 310, by further comprising forming a plurality of through holes (first through hole 332, second through hole 334, and third through hole 336), each of the through holes corresponding to one of the first hole 322 and second hole 324 of the interlayer dielectric layer 340. The first through hole 332 is configured to have a larger width than the second through hole 334, which in turn has a larger width than the third through hole 336. After forming the recess 330 of substrate 320, the first through hole 332, second through hole 334, and third through hole 336 are formed in the substrate 320 by etching. The first through hole 332, formed at a bottom of the recess 330, is predetermined at the first hole 322 in the interlayer dielectric layer 340. The second through hole 334 and third through hole 336 are formed in the substrate 320, which are predetermined in the interlayer dielectric layer 340 at the bottom of the second hole 324 and third hole 326, respectively.

The first through hole 332, second through hole 334, and third through hole 336 are configured to draw a portion of the transport fluid in the first fluid transport stage or the second fluid transport stage. In the first fluid transport stage, a vacuum apparatus (not shown) draws a portion of transport fluid through the first through hole 332 to draw the first micro LED 312 into the first hole 322 and the recess 330 by fluid transport. At same time, the vacuum apparatus also draws particles through the second through hole 334 and the third through hole 336. It will be appreciated that the micro LEDs are very small and thin and sometimes break during or prior to the manufacturing process. Thus, broken pieces of the first micro LEDs can form the particles that pass through the through hole 332.

In the second fluid transport stage, a vacuum apparatus draws a portion of transport fluid through the second through hole 334 and third through hole 336 to draw the second micro LED 314 and third micro LED 316 into the second hole 324 and third hole 326, respectively, by fluid transport. At same time, the vacuum apparatus also draws particles through the first through hole 332. The particles may include broken pieces of the second micro LEDs 314 and the third micro LEDs 316. The ink or slurry is subsequently removed from the light emitting device 310 through a process such as evaporation.

Accordingly, the inclusion of through holes at each assembly site could remove debris, such as ink impurities or device fragments. If sized appropriately, the through holes combined with the holes and recesses may enable the simultaneous and selective self-assembly of micro LEDs, potentially simplifying and shortening the assembly process, as well as enabling the reuse of captured, undisposed devices.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A device, the device comprising:
a substrate assembly including a first material layer disposed over and mechanically bonded to a second material layer, wherein the substrate assembly includes at least a first opening and a second opening; wherein at least one of the first opening or the second opening does not extend into the second material layer; wherein the first opening is configured to accept a light emitting diode of a first size, but not a light emitting diode of a second size; wherein the second opening is configured to accept the light emitting diode of the second size.

2. The device of claim 1, wherein at least one of the first opening or the second opening exhibits a tapered shape.

3. The device of claim 1, wherein at least one of the first opening or the second extends completely through the first material layer.

4. The device of claim 1, wherein the first material layer is formed of a dielectric material.

5. The device of claim 1, wherein the first material layer is disposed on a surface of the second material layer, and wherein at least one of the first opening or the second opening extends into the second material layer and below the surface of the second material layer.

6. The device of claim 1, wherein the device includes a first light emitting diode of the first size and a second light emitting diode of the second size, and
wherein the first light emitting diode exhibits a first shape, and wherein the second light emitting diode exhibits a second shape.

7. The device of claim 5, wherein the first opening is of a first shape and the second opening is of a second shape, and wherein at least one of the first shape or the second shape is either a disc-shape with an area of a lighting surface larger than an electrode surface, or a polygon-shape with an area of a lighting surface larger than an electrode surface.

8. The device of claim 1, wherein the device includes a first light emitting diode of the first size and a second light emitting diode of the second size, wherein the first light emitting diode has a first thickness, wherein the second light emitting diode has a second thickness, and wherein the first thickness is greater than the second thickness.

9. The device of claim 8, wherein the second thickness is approximately the same as a thickness of the first material layer.

10. The device of claim 1, wherein the second opening extends through the first material layer exposing at least one electrode formed on the second material layer.

11. The device of claim 1, wherein the device includes a first light emitting diode of the first size and a second light emitting diode of the second size, wherein the first light emitting diode exhibits a shape that corresponds to the first opening, and the second light emitting diode exhibits a shape that corresponds to the second opening.

12. A display array, the display array comprising:
a substrate assembly including a first material layer disposed over a second material layer, wherein the substrate assembly includes at least a first opening, a second opening, and a third opening; wherein at least one of the first opening, the second opening, or the third opening does not extend into the second material layer, and wherein at least one of the first opening, the second opening, or the third opening extends through the first material layer to the second material layer;
wherein the first opening is configured to accept a light emitting diode of a first size, but not a light emitting diode of a second size or a light emitting diode of a third size;
wherein the second opening is configured to accept the light emitting diode of the second size but not a third size; and
wherein the third opening is configured to accept the light emitting diode of the third size;
a first light emitting diode of the first size disposed in the first opening;
a second light emitting diode of the second size disposed in the second opening; and
a third light emitting diode of the third size disposed in the third opening.

13. The display array of claim 12, wherein the display array further comprises:
a first electrical connection electrically coupled to the first light emitting diode;
a second electrical connection to the second light emitting diode; and
a third electrical connection to the third light emitting diode.

14. The display array of claim 13:
wherein a combination of the first electrical connection and the first light emitting diode form a first color of a pixel;
wherein a combination of the second electrical connection and the second light emitting diode form a second color of the pixel; and
wherein a combination of the third electrical connection and the third light emitting diode form a third color of the pixel.

15. The display array of claim 14, wherein a combination of the first color, the second color, and the third color is selected from a group consisting of: (1) the first color is red, the second color is green, and the third color is blue; (2) the first color is red, the second color is blue, and the third color is green; (3) the first color is green, the second color is red, and the third color is blue; (4) the first color is green, the second color is blue, and the third color is red; (5) the first color is blue, the second color is green, and the third color is red; and (6) the first color is blue, the second color is red, and the third color is green.

16. The display array of claim 12, wherein at least one of the first opening or the second opening exhibits a tapered shape.

17. The display array of claim 12, wherein at least one of the first opening or the second extends completely through the first material layer.

18. The display array of claim 12, wherein the first material layer is formed of a dielectric material.

19. The display array of claim 12, wherein the first light emitting diode has a first thickness, wherein the second light emitting diode has a second thickness, and wherein the first thickness is greater than the second thickness.

20. The display array of claim 19, wherein the second thickness is approximately the same as a thickness of the first material layer.

21. A display array, the display array comprising:
a substrate assembly including a first material layer disposed over and mechanically bonded to a second material layer, wherein the substrate assembly includes at least a first opening, a second opening, and a third opening; wherein at least one of the first opening, the second opening, or the third opening does not extend into the second material layer;
wherein the first opening is configured to accept a light emitting diode of a first size, but not a light emitting diode of a second size or a light emitting diode of a third size;
wherein the second opening is configured to accept the light emitting diode of the second size but not a third size; and
wherein the third opening is configured to accept the light emitting diode of the third size;
a first light emitting diode of the first size disposed in the first opening;
a second light emitting diode of the second size disposed in the second opening; and
a third light emitting diode of the third size disposed in the third opening.

22. A device, the device comprising:
a substrate assembly including a first material layer disposed over a second material layer, wherein the substrate assembly includes at least a first opening and a second opening, wherein at least one of the first opening or the second opening does not extend into the second material layer, and wherein at least one of the first opening or the second opening extends through the first material layer to the second material layer, wherein the first opening is configured to accept a light emitting diode of a first size, but not a light emitting diode of a second size; wherein the second opening is configured to accept the light emitting diode of the second size.

\* \* \* \* \*